(12) United States Patent
Lee et al.

(10) Patent No.: US 7,486,216 B2
(45) Date of Patent: Feb. 3, 2009

(54) MULTI-BIT PIPELINE ANALOG-TO-DIGITAL CONVERTER CAPABLE OF ALTERING OPERATING MODE

(75) Inventors: Seung Chul Lee, Daejeon (KR); Young Deuk Jeon, Daejeon (KR); Kwi Dong Kim, Daejeon (KR); Chong Ki Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/707,614

(22) Filed: Feb. 16, 2007

(65) Prior Publication Data

US 2008/0129567 A1    Jun. 5, 2008

(30) Foreign Application Priority Data

Dec. 4, 2006    (KR) .............................. 2006-121756

(51) Int. Cl.
*H03M 1/38* (2006.01)
(52) U.S. Cl. ........................................ 341/161; 341/155
(58) Field of Classification Search .................. 341/155, 341/144, 161, 131, 139
See application file for complete search history.

(56) References Cited

U.S. PATENT DOCUMENTS

| | | | | |
|---|---|---|---|---|
| 5,353,244 | A | * | 10/1994 | Peters et al. .................... 708/3 |
| 5,635,937 | A | * | 6/1997 | Lim et al. ..................... 341/161 |
| 6,323,800 | B1 | * | 11/2001 | Chiang ........................ 341/161 |
| 7,098,834 | B2 | | 8/2006 | Linder et al. |
| 7,116,255 | B2 | * | 10/2006 | Lee et al. ..................... 341/144 |

(Continued)

FOREIGN PATENT DOCUMENTS

JP    2002-064381    2/2002

(Continued)

OTHER PUBLICATIONS

"A 10-bit 44-MS/s 20-mW Configurable Time-Interleaved Pipeline ADC for Dual-Mode 802.11b/Bluetooth Receiver," by Bo Xia et al.; *IEEE Journal of Solid-State Circuits*, vol. 41, No. 3, Mar. 2006; pp. 530-539.

*Primary Examiner*—Peguy JeanPierre
(74) *Attorney, Agent, or Firm*—Blakely, Sokoloff, Taylor & Zafman LLP

(57) ABSTRACT

Provided is a multi-bit pipeline analog-to-digital converter (ADC) capable of altering an operating mode. The ADC includes: a sample-and-hold amplifier (SHA) for sampling and holding an input analog voltage; an n+1 number of B-bit flash ADCs for receiving an analog signal and converting the analog signal into a digital signal to output the digital signal; an n number of B-bit multiplying digital-to-analog converters (MDACs) for converting a difference between the digital signal output from the B-bit flash ADC and the front-stage output signal into an analog signal to output the analog signal to the next stage; and a mode control circuit for generating n-bit control signals to control the B-bit flash ADC and the B-bit MDAC according to required resolution and operating frequency. In the multi-bit pipeline ADC, an operating mode is altered by controlling the number of stages in a pipeline and a signal path according to required resolution and operating frequency, so that power consumption can be minimized under the corresponding operating condition and signals can be processed in a variety of ways.

6 Claims, 8 Drawing Sheets

U.S. PATENT DOCUMENTS

| | | | |
|---|---|---|---|
| 7,250,894 B2 * | 7/2007 | Lee | 341/155 |
| 7,313,380 B2 * | 12/2007 | Yamaji | 455/264 |
| 2003/0164786 A1 | 9/2003 | Wolf et al. | |
| 2004/0145508 A1 | 7/2004 | Gulati et al. | |

FOREIGN PATENT DOCUMENTS

| | | |
|---|---|---|
| JP | 2003-174364 | 6/2003 |
| JP | 2004-214905 | 7/2004 |
| KR | 1997-0005828 | 4/1997 |
| KR | 10-2004-0033630 | 4/2004 |
| KR | 10-2006-0078685 | 7/2006 |
| KR | 10-2006-0093231 | 8/2006 |

* cited by examiner

MULTI-BIT PIPELINE ANALOG-TO-DIGITAL CONVERTER CAPABLE OF ALTERING OPERATING MODE

CROSS-REFERENCE TO RELATED APPLICATION

This application claims priority to and the benefit of Korean Patent Application No. 2006-0121756, filed Dec. 4, 2006, the disclosure of which is incorporated herein by reference in its entirety.

BACKGROUND

1. Field of the Invention

The present invention relates to a multi-bit pipeline analog-to-digital converter (ADC) capable of altering an operating mode and, more particularly, to a multi-bit pipeline ADC in which an operating mode is altered by controlling the number of stages in a pipeline and a signal path according to required resolution and operating frequency so that power consumption can be minimized.

2. Discussion of Related Art

In order to process an image signal in an imaging system, a small analog signal needs to be converted into a digital signal sensitive to a noise. The conversion of the analog signal into the digital signal is performed using an ADC.

Since image data output from a sensor is very minute, the imaging system requires a high-resolution ADC capable of distinguishing a small signal. In addition to the imaging system, communication systems and image processing/application systems, such as mobile communication devices, asynchronous digital subscriber loops (ADSLs), IMT-2000, digital camcorders, and High Definition Televisions (HDTVs), also require high-resolution ADCs that have a high resolution (12-/14-bit) and a high sampling rate of several tens of MHz.

Among the variety of known ADC structures, a flash ADC, a folding ADC, a subranging ADC, and a pipeline ADC are able to process signals at a high speed. In recent years, a pipeline ADC structure, which consumes low power and occupies a small area, has been widely used to satisfy both conditions of high-speed signal processing and a high resolution at the same time.

A conventional pipeline ADC may be classified into a single-bit structure, which decides 1 bit for each stage, and a multi-bit structure, which decides 2 bits or more for each stage. In general, a high-resolution pipeline ADC has adopted the multi-bit structure to a greater extent than the single-bit structure which requires many stages, because the multi-bit structure decides many bits at a first stage to lessen the influence of the next stage and reduce power consumption and an occupied area.

FIG. 1 is a circuit diagram of a conventional multi-bit pipeline ADC.

Referring to FIG. 1, the multi-bit pipeline ADC includes several stages, so that an analog input signal $V_{IN}$ passes through a sample-and-hold amplifier (SHA) 10 and is converted into a digital signal at each of stages $ST_1$ to $ST_n$, and is output. For example, the stage $ST_1$ includes a B-bit flash ADC 20 and a B-bit multiplying digital-to-analog converter (MDAC) 30. The B-bit flash ADC 20 receives an analog signal from a front stage, converts the analog signal into a digital signal, and outputs the digital signal. The B-bit MDAC 30 converts a difference between the digital signal output from the B-bit flash ADC 20 and the front-stage output signal into an analog signal and outputs the analog signal into the next stage.

In other words, the conventional multi-bit pipeline ADC includes one SHA 10 for an input terminal, an n+1 number of B-bit flash ADCs 20, and an n number of B-bit MDACs 30. In this case, the entire multi-bit ADC has a resolution of n*(B−1)+B.

However, when the conventional multi-bit pipeline ADC is designed for a predetermined operating speed and a resolution of one application or designed for the highest specifications of several applications and operates for a system having low specifications, the multi-bit pipeline ADC reduces power consumption by adjusting the amount of current. As a result, controlling the entire current becomes complicated, and optimizing the multi-bit pipeline ADC in terms of power consumption is difficult.

Specifically, the accuracy of a signal output from an output terminal of an i-th MDAC should be on the level of $$\frac{1}{2^{(n-i)*(B-1)+B}}.$$

When a clock frequency of the entire ADC is referred to as "fs", since the operating speed of an amplifier, which is required by the i-th MDAC, is proportional to $\ln(2^{(n-i)*(B-1)+B})$, the i-th MDAC is designed to output a signal with the same accuracy at a higher speed than an i+1-th MDAC by $$\frac{(n-i)*(B-1)+B}{(n-i-1)*(B-1)+B}.$$

For instance, assuming that n=3 and B=3, since the entire ADC has a 9-bit resolution, and a first-stage MDAC should output a signal with 7-bit accuracy and a second-stage MDAC should output a signal with 5-bit accuracy, the first-stage MDAC is designed to operate faster than the second-stage MDAC by 7/5(140%).

However, when the conventional multi-bit pipeline ADC is simultaneously used for several applications, the multi-bit pipeline may be designed for the highest specifications and operate for a system having low specifications. In this case, the multi-bit pipeline ADC reduces power consumption by adjusting the amount of current. For example, when the multi-bit pipeline ADC using one ADC is required to operate at a speed of 50 MHz and have 10- and 8-bit resolution, the multi-bit pipeline ADC is designed for 10-bit resolution and utilizes most significant 8 bits for an 8-bit application. In this case, when the multi-bit pipeline ADC has the same operating speed of 50 MHz as in a 10-bit application, power consumption may be minimized by reducing the whole amount of current to about 80%. However, in the front-stage MDAC for outputting most significant bits (MSBs), capacitance and an amplifier are set to meet a 10-bit resolution. Thus, larger current is generated than in an amplifier that is actually designed for an 8-bit resolution, and a current control method becomes complicated. As a result, it is difficult to optimize the multi-bit pipeline ADC in terms of power consumption.

In other words, since the conventional multi-bit pipeline ADC has predetermined operating speed and resolution, when the multi-bit pipeline ADC is used for several applications at the same time, it is difficult to minimize power consumption under an operating condition of low specifications.

SUMMARY OF THE INVENTION

The present invention is directed to a multi-bit pipeline analog-to-digital converter (ADC) in which an operating mode is altered by controlling the number of stages in a pipeline and a signal path according to resolution and operating frequency, so that power consumption can be minimized and signals can be processed in a variety of ways.

One aspect of the present invention provides a multi-bit pipeline ADC including: a sample-and-hold amplifier (SHA) for sampling and holding an input analog voltage; an n+1 number of B-bit flash ADCs for receiving an analog signal and converting the analog signal into a digital signal to output the digital signal; an n number of B-bit multiplying digital-to-analog converters (MDACs) for converting a difference between the digital signal output from the B-bit flash ADC and the front-stage output signal into an analog signal to output the analog signal to the next stage; and a mode control circuit for generating n-bit control signals to control the B-bit flash ADC and the B-bit MDAC according to required resolution and operating frequency.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

The present invention will be more fully described hereinafter with reference to the accompanying drawings, in which exemplary embodiments of the invention are shown.

Figure 1:
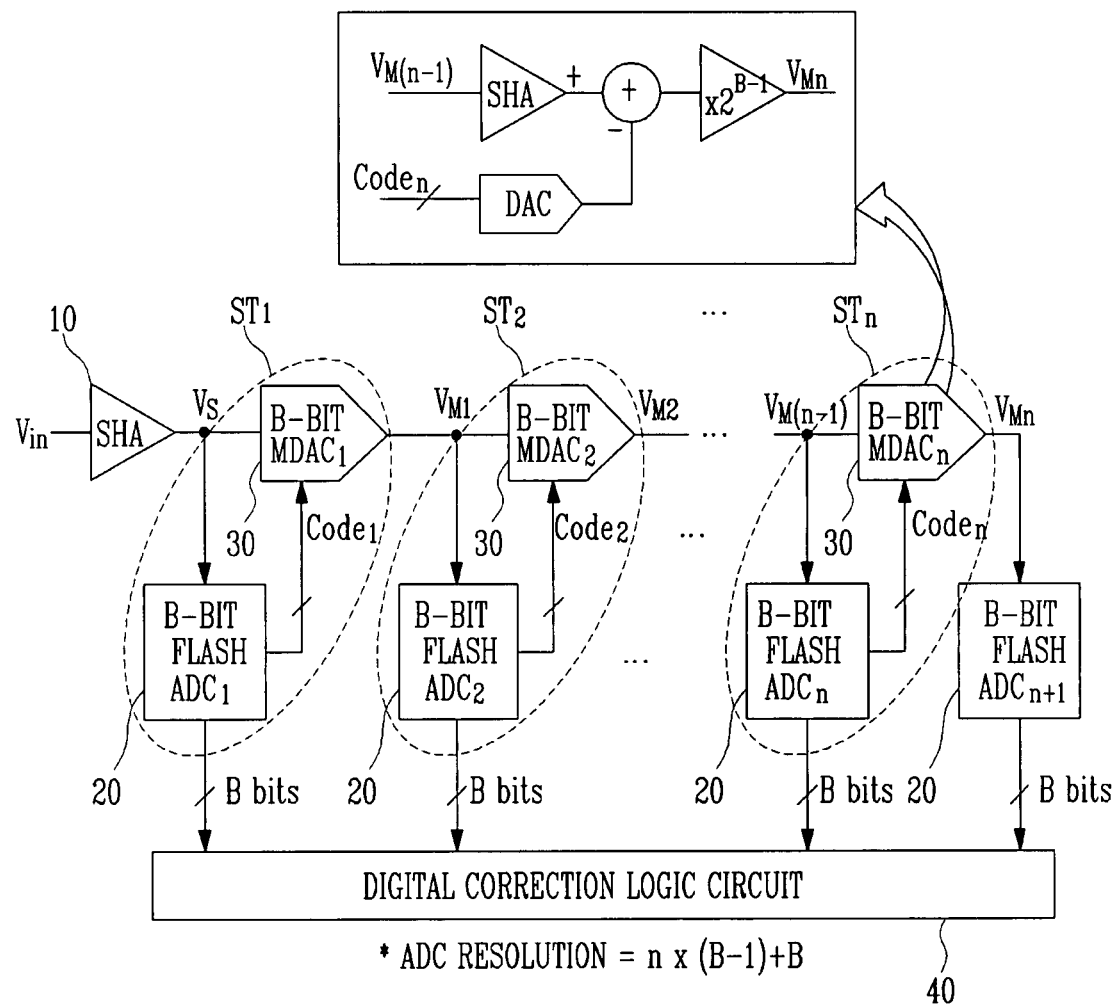
FIG. 1 is a circuit diagram of a conventional multi-bit pipeline analog-to-digital converter (ADC)
Figure 2:
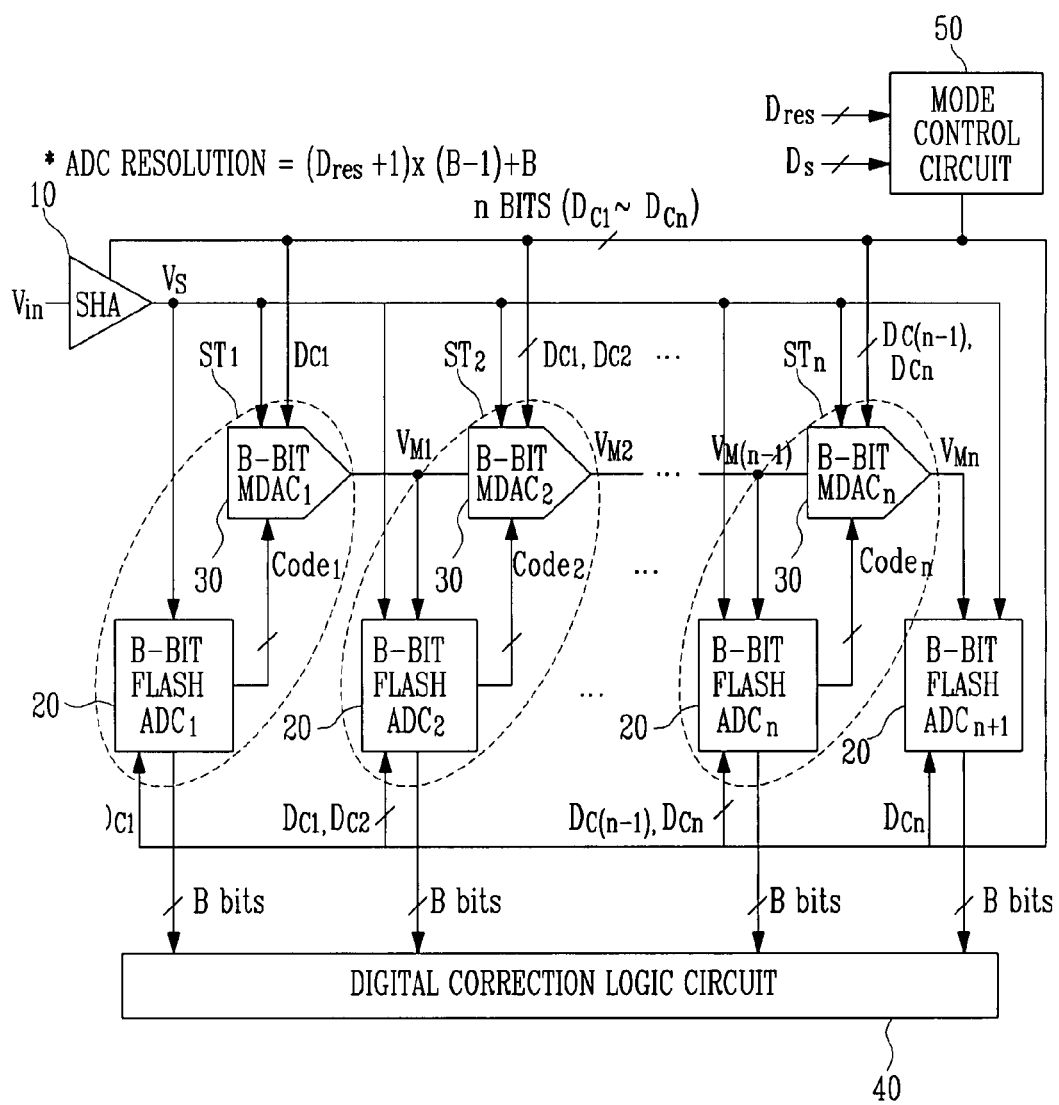
FIG. 2 is a circuit diagram of a multi-bit pipeline ADC capable of altering an operating mode according to an exemplary embodiment of the present invention.

FIG. 2 is a circuit diagram of a multi-bit pipeline analog-to-digital converter (ADC) capable of altering an operating mode according to an exemplary embodiment of the present invention.

Referring to FIG. 2, the multi-bit pipeline ADC capable of altering an operating mode according to an exemplary embodiment of the present invention includes a sample-and-hold amplifier (SHA) 10 for an input terminal, a digital correction logic circuit 40, a mode control circuit 50, and several stages. The SHA 10 samples and holds an input analog voltage, and the digital correction logic circuit 40 corrects an error in a digital signal. The mode control circuit 50 generates n-bit control signals $D_{C1}$ to $D_{Cn}$ to control a B-bit flash ADC 20 and a B-bit multiplying digital-to-analog converter (MDAC) 30 according to a required resolution Dres and an operating frequency Ds. Each of the stages includes the B-bit flash ADC 20 and the B-bit MDAC 30. The B-bit flash ADC 20 receives an analog signal from the front stage, converts the analog signal into a digital signal, and outputs the digital signal. The B-bit MDAC 30 converts a difference between the digital signal output from the B-bit flash ADC 20 and the front-stage output signal into an analog signal and outputs the analog signal to the next stage.

The n-bit control signals $D_{C1}$ to $D_{Cn}$ indicate whether the MDAC 30 of each of the stages operates or not. For example, when a voltage Vs passing through the SHA 10 is directly applied to an $MDAC_2$ 30 of a second stage and output as a final digital output signal through an $MDAC_3$ 30 of a third stage, an $MDAC_1$ 30 of a first stage does not operate. Thus, the n-bit control signal $D_{C1}$ has a low output, while the n-bit control signals $D_{C2}$ and $D_{C3}$ have high outputs. Also, since none of the MDACs 30 of the remaining stages (i.e., fourth through n-th stages) operate, all the n-bit control signals $D_{C4}$, $D_{C5}$, ..., and $D_{Cn}$ have low outputs.

That is, it is possible to control the resolution of the entire ADC by adjusting the number of the MDACs 30 required for a signal processing operation. Furthermore, it is also possible to control the operating speed of the entire ADC by adjusting the position of the MDAC 30 from which digital conversion starts (i.e., the position of the MDAC 30 to which the voltage Vs passing through the SHA 10 is applied).

For example, when all the MDACs 30 of the multi-bit pipeline ADC according to the present invention are used (i.e., when the voltage Vs passing through the SHA 10 is applied to the $MDAC_1$ of the first stage), assuming that each MDAC 30 outputs a 2-bit signal (B=2), the $MDAC_2$ 30 of the second stage should be designed to have an 11-bit resolution and an operating speed of 50 MHz and the $MDAC_3$ 30 of the third stage should be designed to have a 10-bit resolution and an operating speed of 50 MHz so that the multi-bit pipeline ADC can have a 12-bit resolution and an operating speed of 50 MHz. Thus, when the voltage Vs passing through the SHA 10 for an input terminal is directly applied to the $MDAC_3$ 30 of the third stage, the voltage Vs passes through the same signal path as in the case where a 10-bit 50-MHz ADC is designed. In this case, by operating none of $MDAC_1$, $MDAC_2$, flash $ADC_1$, and flash $ADC_2$, and cutting off the entire signal path related with $MDAC_1$, $MDAC_2$, flash $ADC_1$, and flash $ADC_2$, the multi-bit pipeline ADC may operate to consume about the same power as an optimized 10-bit 50-MHz ADC.

In a case where a 10-bit 50-MHz-plus ADC is required, while the voltage Vs passing through the SHA 10 for an input terminal is being applied to the $MDAC_1$ to operate the $MDAC_1$, the operations of two final MDACs 30 (i.e., an $MDAC_{(n-1)}$ and an $MDAC_{(n)}$) may be brought to an end. Alternatively, while the voltage Vs passing through the SHA 10 for an input terminal is being applied to the $MDAC_2$ to operate the $MDAC_2$, the operations of the $MDAC_1$ and the $MDAC_{(n)}$ may be brought to an end. In this case, when the voltage Vs passing through the SHA 10 for an input terminal is directly applied to the $MDAC_1$, a 10-bit resolution and an operating speed of about 60 MHz (50 MHz*11/9) can be obtained. Also, when the voltage Vs passing through the SHA 10 for an input terminal is directly applied to the $MDAC_2$, a 10-bit resolution and an operating speed of about 55 MHz (50 MHz*10/9) can be obtained.

Therefore, a signal path and an MDAC block to operate may be decided according to the control signals $D_{C1}$ to $D_{Cn}$. As a result, power consumption can be minimized in an operating mode that is controlled to meet the required resolution Dres and the operating frequency Ds.

Figure 3A:
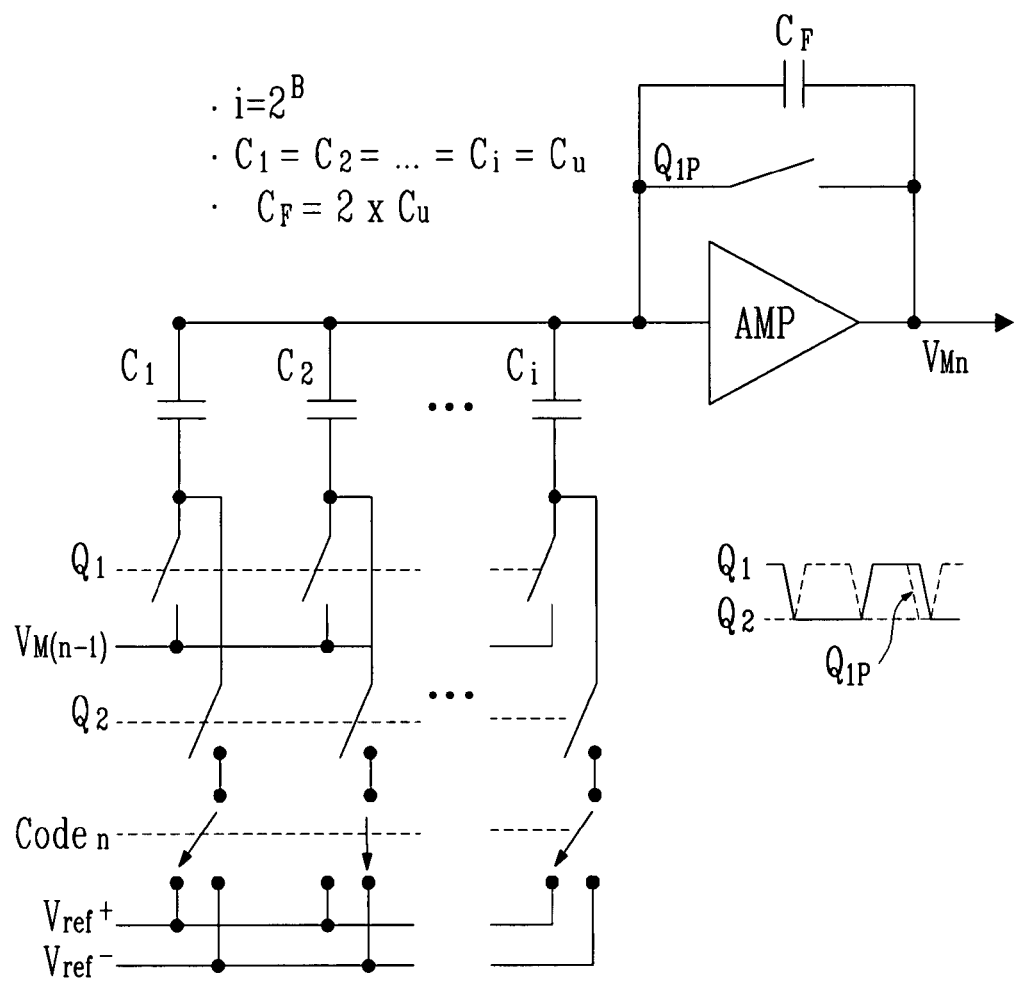
FIGS. 3A and 3B illustrate a conventional multiplying digital-to-analog converter (MDAC) circuit and an MDAC circuit according to an exemplary embodiment of the present invention, respectively.
Figure 3B:
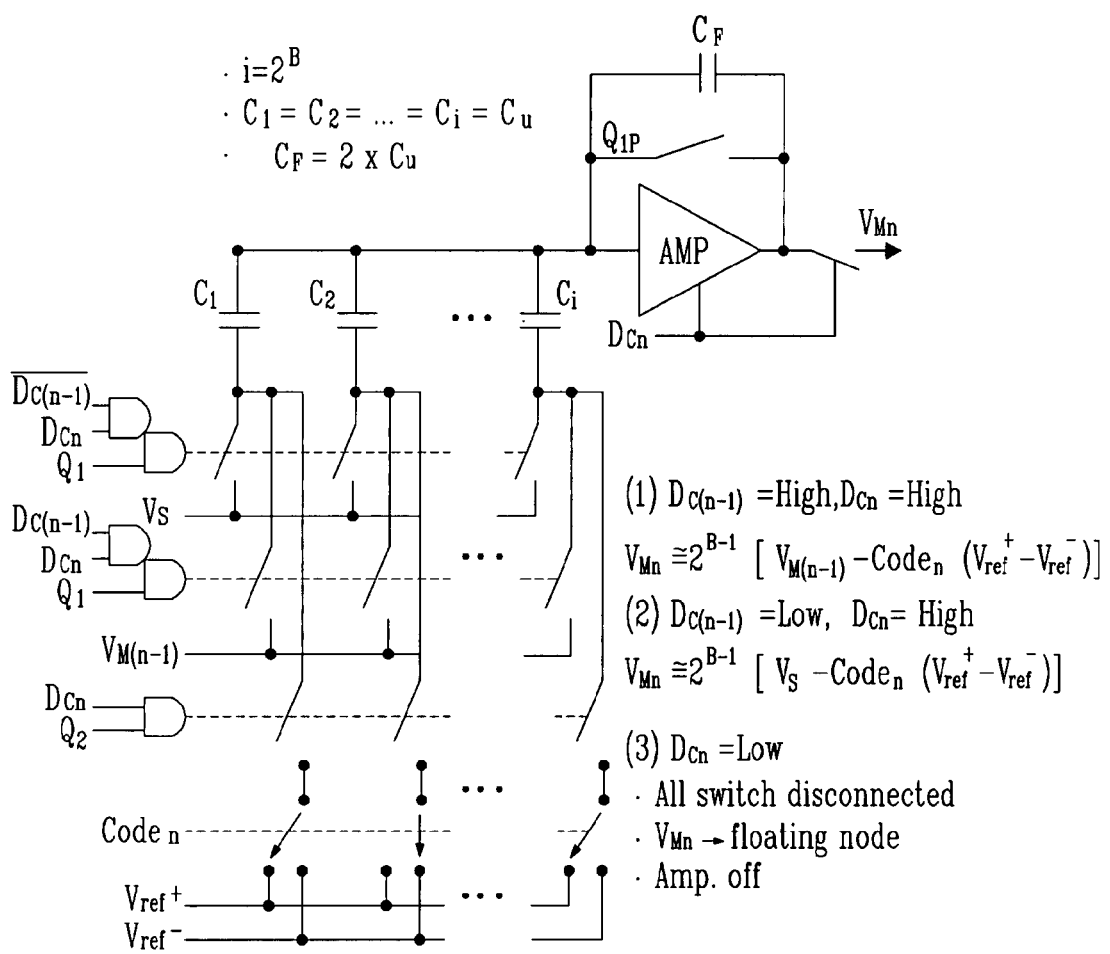

FIGS. 3A and 3B illustrate a conventional MDAC circuit and an MDAC circuit according to an exemplary embodiment of the present invention, respectively.

Referring to FIG. 3A, the conventional MDAC circuit samples an output signal from the front stage in a first clock phase Q1, subtracts a certain analog value from the sampled signal according to a code input from the flash ADC 20 in a second clock phase Q2, amplifies the result value by $2^{B-1}$, and outputs the amplified value.

Referring to FIG. 3B, the MDAC circuit according to the present invention receives different input signals in one phase depending on whether the control signal is the signal $D_{C(n)}$ or the signal $D_{C(n-1)}$. First, when the control signal $D_{C(n)}$ is at a low level, the operation of the corresponding MDAC should be ended. Thus, all switches are switched off and current is not supplied to an amplifier. When the control signal $D_{C(n)}$ is at a high level, switch connection in the first clock phase Q1 is dependent on the value of the control signal $D_{C(n-1)}$ (or on whether the front-stage MDAC 30 operates or not). Specifically, when the control signal $D_{C(n-1)}$ is at a high level, the front-stage MDAC 30 operates normally, so that a switch is connected to an output terminal $V_{M(n-1)}$ of the front-stage MDAC 30 in the first clock phase Q1. However, when the control signal $D_{C(n-1)}$ is at a low level, the front-stage MDAC 30 does not operate, so that the voltage Vs passing through the SHA 10 is directly connected to an input of the $MDAC_n$.

Figure 4A:
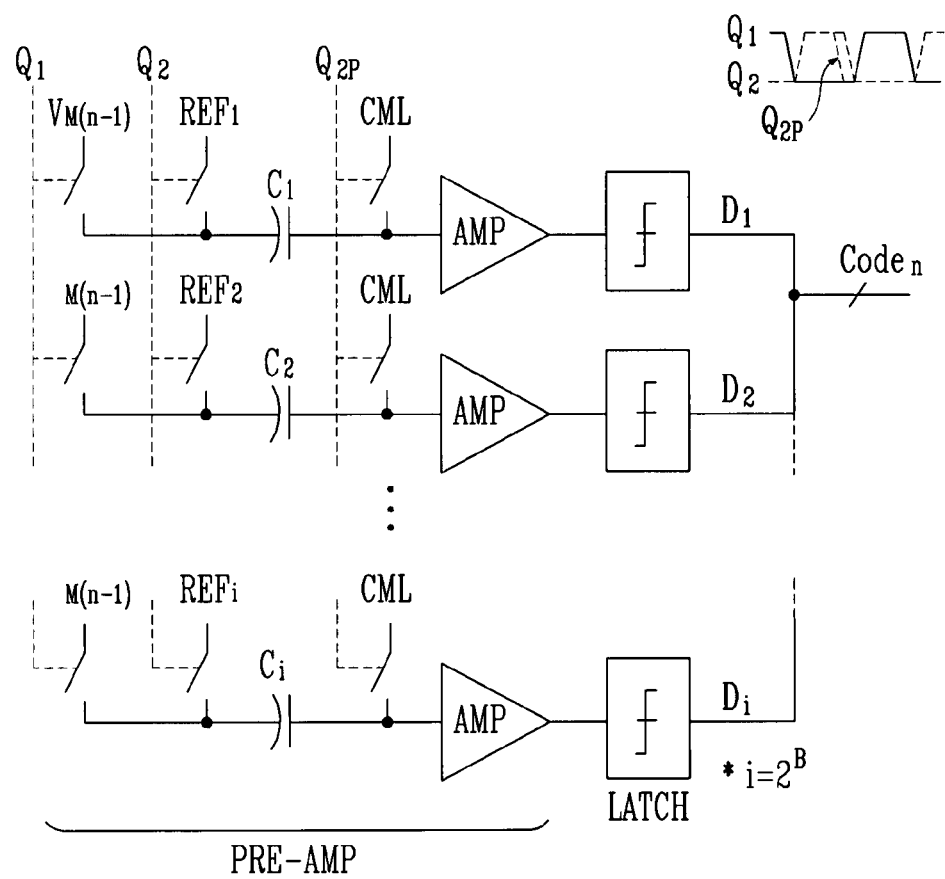
FIGS. 4A and 4B illustrate a conventional flash ADC circuit and a flash ADC circuit according to an exemplary embodiment of the present invention, respectively.
Figure 4B:
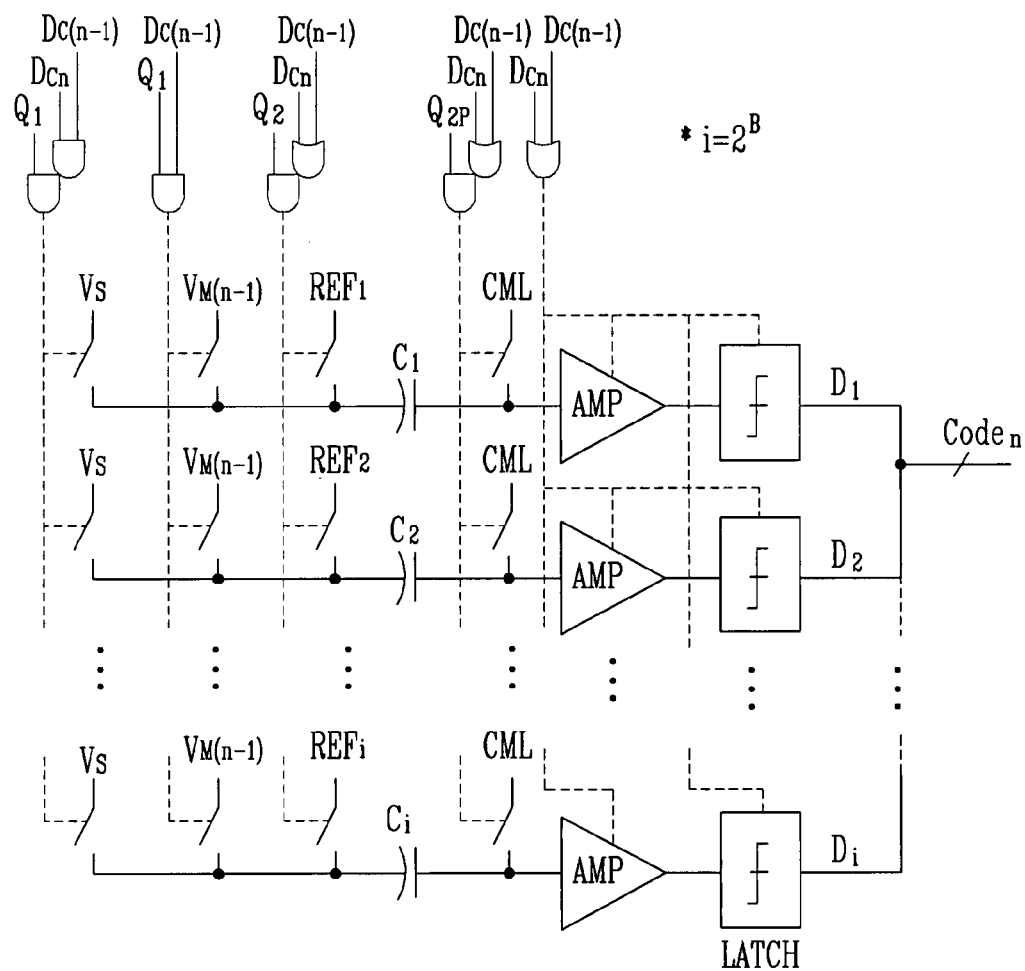

FIGS. 4A and 4B illustrate a conventional flash ADC circuit and a flash ADC circuit according to an exemplary embodiment of the present invention, respectively.

Referring to FIG. 4A, the conventional flash ADC circuit samples a reference voltage REFi from a resistor array in a second clock phase Q2 and amplifies a difference between the sampled reference voltage REFi and an output signal $V_{M(n-1)}$ from the front-stage $MDAC_{(n-1)}$ in a first clock phase Q1.

Referring to FIG. 4B, the flash ADC according to the present invention receives different input signals in one phase depending whether the control signal is the signal $D_{C(n)}$ or the signal $D_{C(n-1)}$. When the $MDAC_{(n-1)}$ operates (i.e., when the control signal $D_{C(n-1)}$ is at a high level), the flash ADC receives the signal $V_{M(n-1)}$ from the $MDAC_{(n-1)}$ in the first clock phase Q1. When the $MDAC_n$ operates and the front-stage MDAC does not operate (i.e., when the control signal $D_{C(n-1)}$ is at a low level and the control signal $D_{C(n)}$ is at a high level), because the corresponding flash ADC is included in the first stage, the switch is connected to the voltage Vs in the first clock phase Q1. When none of the $MDAC_{(n-1)}$ and the $MDAC_n$ operate (i.e., when both the control signals $D_{C(n-1)}$ and $D_{C(n)}$ are at a low level), since an n-th flash ADC does not need to operate, all the switches are switched off, and current is not supplied to amplifiers and latches.

Figure 5:
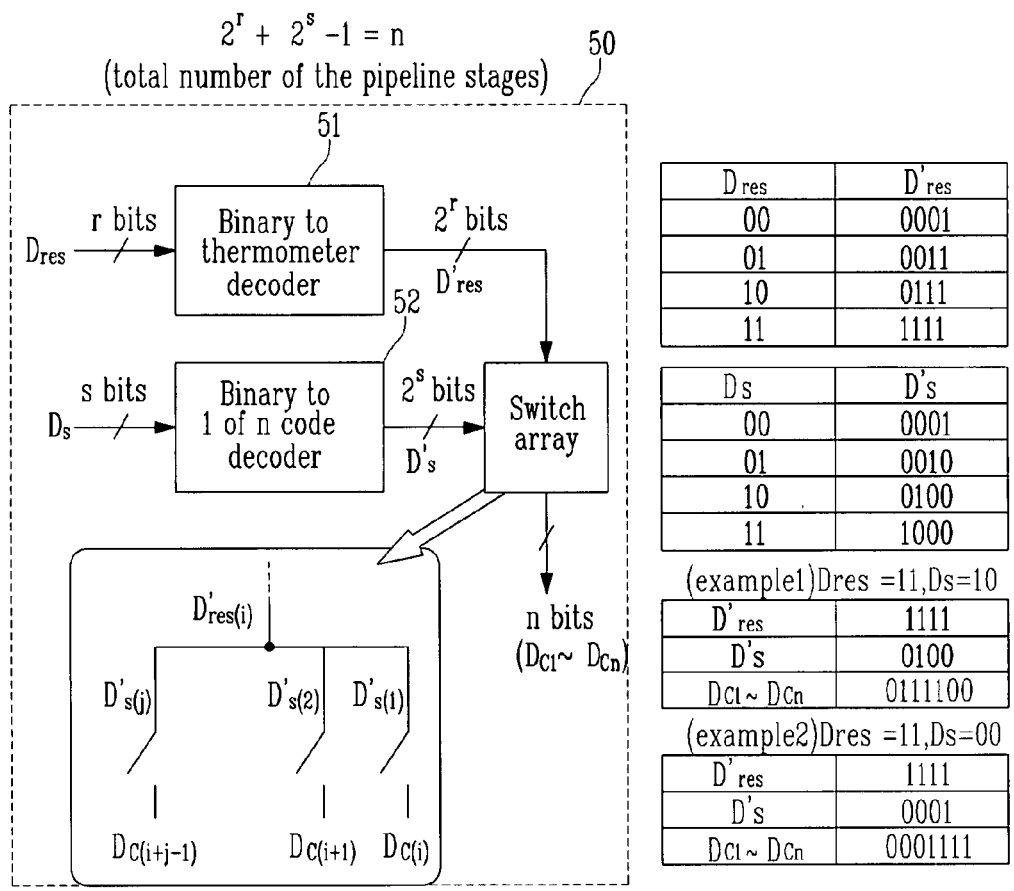
FIG. 5 is a diagram for explaining the operation of a mode control circuit of the multi-bit pipeline ADC shown in FIG. 2.
Figure 6:
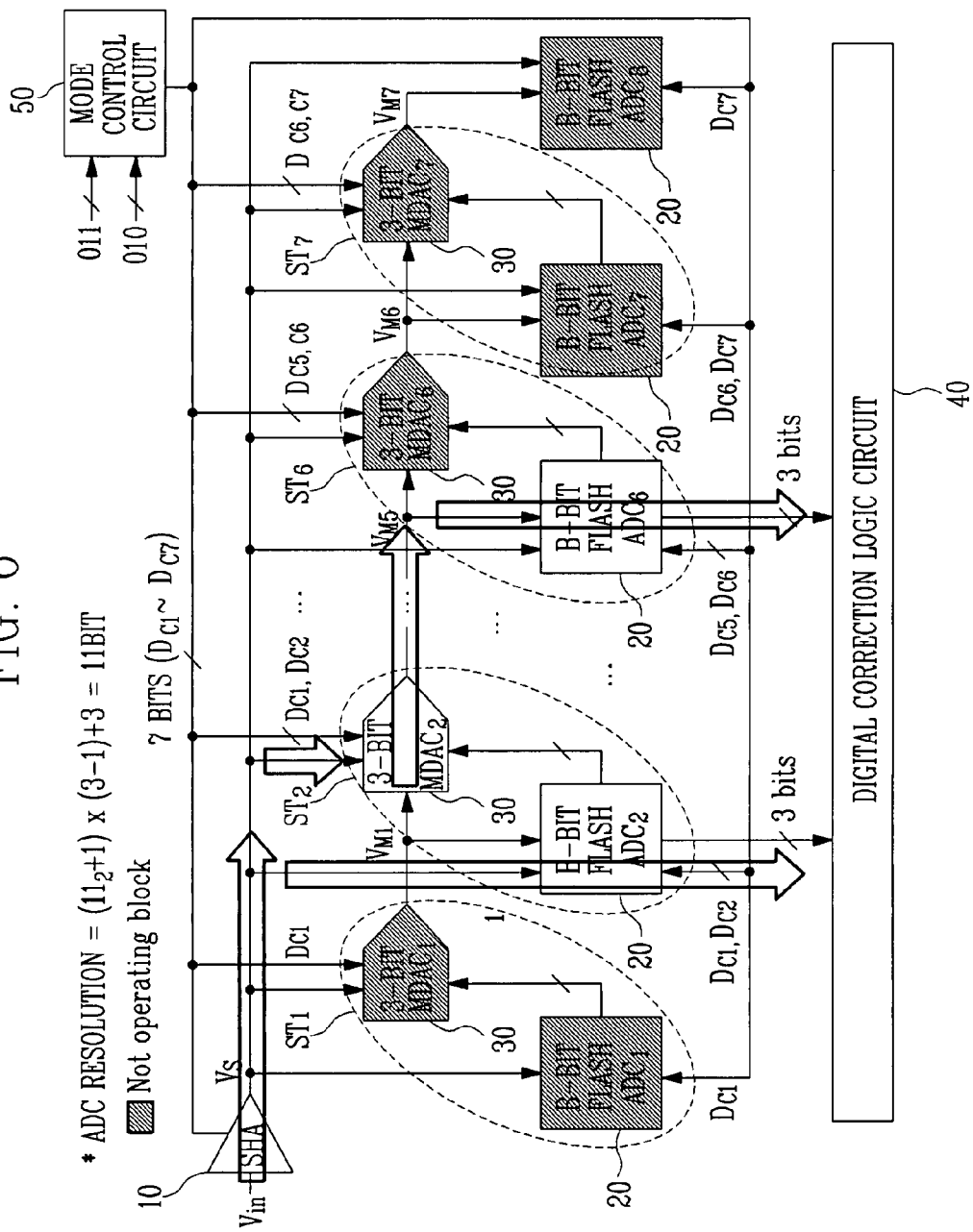
FIG. 6 is a diagram for explaining the operation of the multi-bit pipeline ADC using the mode control circuit shown in FIG. 5.

FIG. 5 is a diagram for explaining the operation of a mode control circuit of the multi-bit pipeline ADC shown in FIG. 2, and FIG. 6 is a diagram for explaining the operation of the multi-bit pipeline ADC using the mode control circuit shown in FIG. 5.

Referring to FIG. 5, in the multi-bit pipeline ADC according to the present invention, the mode control circuit 50 controls the resolution and operating speed of the ADC according to r-bit Dres and s-bit Ds. Initially, the value Dres, which determines the resolution of the ADC, is converted into a thermometer code D'res via a binary-to-thermometer decoder 51, while the value Ds, which determines the operating speed of the ADC, is converted into a 1 of n code (D's) via a binary-to-1 of n code decoder 52. While the converted thermometer code D'res passes through a switch array 53 in which the position of in n-bit is determined by the code D's, n-bit control signals $D_{C1}$ to $D_{Cn}$ are generated.

For example, when the value Dres is 11 and the value Ds is 10 (i.e., when 2-bit Dres (r=2) and 2-bit Ds (s=2) are input and correspond to '11' and '10', respectively), the value Dres is converted into a code D'res having a value of '1111' via the binary-to-thermometer decoder 51, and the value Ds is converted into a code D's having a value of '0100' via the binary-to-1 of n code decoder 52, so that 7-bit control signals $D_{C1}$ to $D_{Cn}$, namely, '0111100' are generated. In this case, the number 'n' of bits of the control signal is determined by $2^r + 2^s - 1 = n$.

Referring to FIG. 6, when the MDAC 30 of each stage is a 3-bit MDAC and the value Dres (=011) and the value Ds (=010) are input to the MDAC 30, the multi-bit pipeline ADC according to the present invention has an 11-bit resolution, and the mode control circuit 50 generates the 7-bit control signals $D_{C1}$ to $D_{Cn}$ (i.e., '011110') to control the flash ADC 20 and the MDAC 30 according to the values Dres and Ds. The voltage Vs passing through the SHA 10 for an input terminal is applied to the flash $ADC_2$, flash $ADC_3$, flash $ADC_4$, flash $ADC_5$, and flash $ADC_6$ and the $MDAC_2$, $MDAC_3$, $MDAC_4$, and $MDAC_5$ in response to the control signal '011100'. In this case, the voltage Vs passing through the SHA 10 is not applied to the flash $ADC_1$, flash $ADC_7$, flash $ADC_8$, the $MDAC_1$, $MDAC_6$, and $MDAC_7$, and the corresponding blocks do not operate.

As described above, the mode control circuit 50 generates the control signals $D_{C1}$ to $D_{Cn}$ for controlling the flash ADC 20 and the MDAC 30 according to the required resolution Dres and operating frequency Ds. Thus, a signal path and the MDAC block to operate are determined in response to the control signals $D_{C1}$ to $D_{Cn}$, so that when one multi-bit pipeline ADC is applied to various systems, power consumption can be minimized in each operating mode that is controlled to meet the required resolution Dres and the operating frequency Ds.

According to the present invention as described above, in a multi-bit pipeline ADC, an operating mode can be altered by controlling the number of stages in a pipeline and a signal path according to required resolution and operating frequency. Therefore, the multi-bit pipeline ADC according to the present invention can be applied to various systems, and power consumption can be minimized in each operating mode.

In the drawings and specification, typical preferred embodiments of the invention have been disclosed and, although specific terms are employed, they are used in a generic and descriptive sense only and not for purposes of limitation. The scope of the invention is to be set forth in the following claims. Therefore, it will be understood by those of ordinary skill in the art that various changes in form and details may be made therein without departing from the spirit and scope of the present invention as defined by the following claims.

What is claimed is:

1. A multi-bit pipeline analog-to-digital converter (ADC) capable of altering an operating mode, comprising:
   a sample-and-hold amplifier (SHA) for sampling and holding an input analog voltage;
   an n+1 number of B-bit flash ADCs for receiving an analog signal and converting the analog signal into a digital signal to output the digital signal;
   an n number of B-bit multiplying digital-to-analog converters (MDACs) for converting a difference between the digital signal output from the B-bit flash ADC and the front-stage output signal into an analog signal to output the analog signal to the next stage; and a mode control circuit for generating n-bit control signals to control the B-bit flash ADC and the B-bit MDAC according to required resolution and operating frequency, wherein the mode control circuit converts the resolution value into a binary thermometer code, converts the operating frequency value into a 1 of n code, and passes the binary thermometer code through a switch array in which the position in n-bit determined by the 1 of n code to generate the n-bit control signals.

2. The ADC according to claim 1, wherein when the resolution value is r bits and the operating frequency value is s bits, the number of bits of the control signal is $2^r + 2^s - 1$.

3. The ADC according to claim 1, wherein the n-bit control signals indicate whether each of the B-bit MDACs operates or not.

4. The ADC according to claim 1, wherein the B-bit MDAC receives different input signals in one phase in response to the n-bit control signal, when both an n-th control signal and an n−1-th control signal are at a high level, the B-bit MDAC receives an output signal from a front-stage B-bit MDAC in a first clock phase, and when the n-th control signal is at a high level and the n−1-th control signal is at a low level, the B-bit MDAC receives a voltage that passes through the SHA in the first clock phase.

5. The ADC according to claim 1, wherein the B-bit flash ADC receives different input signals in one phase in response to the n-bit control signal, when an n−1-th control signal is at a high level, the B-bit flash ADC receives an output signal from the front-stage B-bit MDAC in a first clock phase, and when the n−1-th control signal is at a low level and an n-th control signal is at a high level, the B-bit flash ADC receives a voltage that passes through the SHA in the first clock phase.

6. The ADC according to claim 1, further comprising a digital correction logic circuit for correcting an error in the digital signal output from the B-bit flash ADC.

* * * * *